(12) United States Patent
Huemoeller et al.

(10) Patent No.: US 7,994,045 B1
(45) Date of Patent: Aug. 9, 2011

(54) BUMPED CHIP PACKAGE FABRICATION METHOD AND STRUCTURE

(75) Inventors: Ronald Patrick Huemoeller, Gilbert, AZ (US); Rex Anderson, Raleigh, NC (US); Ravi Kiran Chilukuri, Cary, NC (US)

(73) Assignee: Amkor Technology, Inc., Chandler, AZ (US)

( * ) Notice: Subject to any disclaimer, the term of this patent is extended or adjusted under 35 U.S.C. 154(b) by 136 days.

(21) Appl. No.: 12/555,449

(22) Filed: Sep. 8, 2009

(51) Int. Cl.
*H01L 21/44* (2006.01)
(52) U.S. Cl. .................. 438/612; 438/613; 438/614
(58) Field of Classification Search .................. 438/612, 438/613, 614; 257/738
See application file for complete search history.

(56) References Cited

U.S. PATENT DOCUMENTS

| | | | |
|---|---|---|---|
| 6,455,408 B1 * | 9/2002 | Hwang et al. | 438/613 |
| 7,498,251 B2 * | 3/2009 | Lu | 438/613 |
| 7,847,407 B2 * | 12/2010 | Watanabe | 257/773 |
| 2007/0246252 A1 * | 10/2007 | Buchwalter et al. | 174/260 |
| 2009/0098723 A1 * | 4/2009 | Yu | 438/614 |
| 2009/0191665 A1 * | 7/2009 | Nikitin et al. | 438/107 |

* cited by examiner

*Primary Examiner* — Lex Malsawma
(74) *Attorney, Agent, or Firm* — Gunnison, McKay & Hodgson, L.L.P.; Serge J. Hodgson

(57) ABSTRACT

A method of fabricating a bumped chip package includes forming a first seed layer on a dielectric layer, the dielectric layer comprising a dielectric layer opening exposing a substrate terminal of a substrate, the first seed layer being formed within the dielectric layer opening and on the substrate terminal. A circuit pattern is plated on the first seed layer, wherein an exposed portion of the first seed layer is exposed from the circuit pattern. The exposed portion of the first seed layer is removed by laser-ablation. By using a laser-ablation process, a chemical etching process is avoided thus eliminating the need to treat or dispose of chemical etching hazardous waste. Further, circuit pattern width erosion and undercut of the circuit pattern associated with a chemical etching process are avoided.

20 Claims, 16 Drawing Sheets

BUMPED CHIP PACKAGE FABRICATION METHOD AND STRUCTURE

BACKGROUND OF THE INVENTION

1. Field of the Invention

The present invention relates generally to methods of fabricating electronic component packages and the resulting structures. More particularly, the present invention relates to a method of fabricating a bumped chip package and the resulting structures.

2. Description of the Related Art

During the formation of wafer level chip packages, a seed layer is blanket formed across the entire substrate. This seed layer is used to plate a conductive circuit pattern. After plating of the conductive circuit pattern, the un-plated portions of the seed layer are removed using chemical etching.

However, chemical etching results in the generation of hazardous waste, which must be treated or disposed of. Treatment or disposal of hazardous waste is expensive and unfavorable for the environment.

Further, during the chemical etching of the seed layer, the circuit pattern is also etched to some degree. This inevitable etching of the circuit pattern causes circuit pattern width erosion and undercut of the circuit pattern and the associated undesirable consequences.

SUMMARY OF THE INVENTION

In accordance with one embodiment, a method of fabricating a bumped chip package includes forming a first seed layer on a dielectric layer, the dielectric layer comprising a dielectric layer opening exposing a substrate terminal of a substrate, the first seed layer being formed within the dielectric layer opening and on the substrate terminal. A circuit pattern is plated on the first seed layer, wherein an exposed portion of the first seed layer is exposed from the circuit pattern. The exposed portion of the first seed layer is removed by laser-ablation.

By using a laser-ablation process, a chemical etching process is avoided thus eliminating the need to treat or dispose of chemical etching hazardous waste. Further, circuit pattern width erosion and undercut of the circuit pattern associated with a chemical etching process are avoided.

These and other features of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
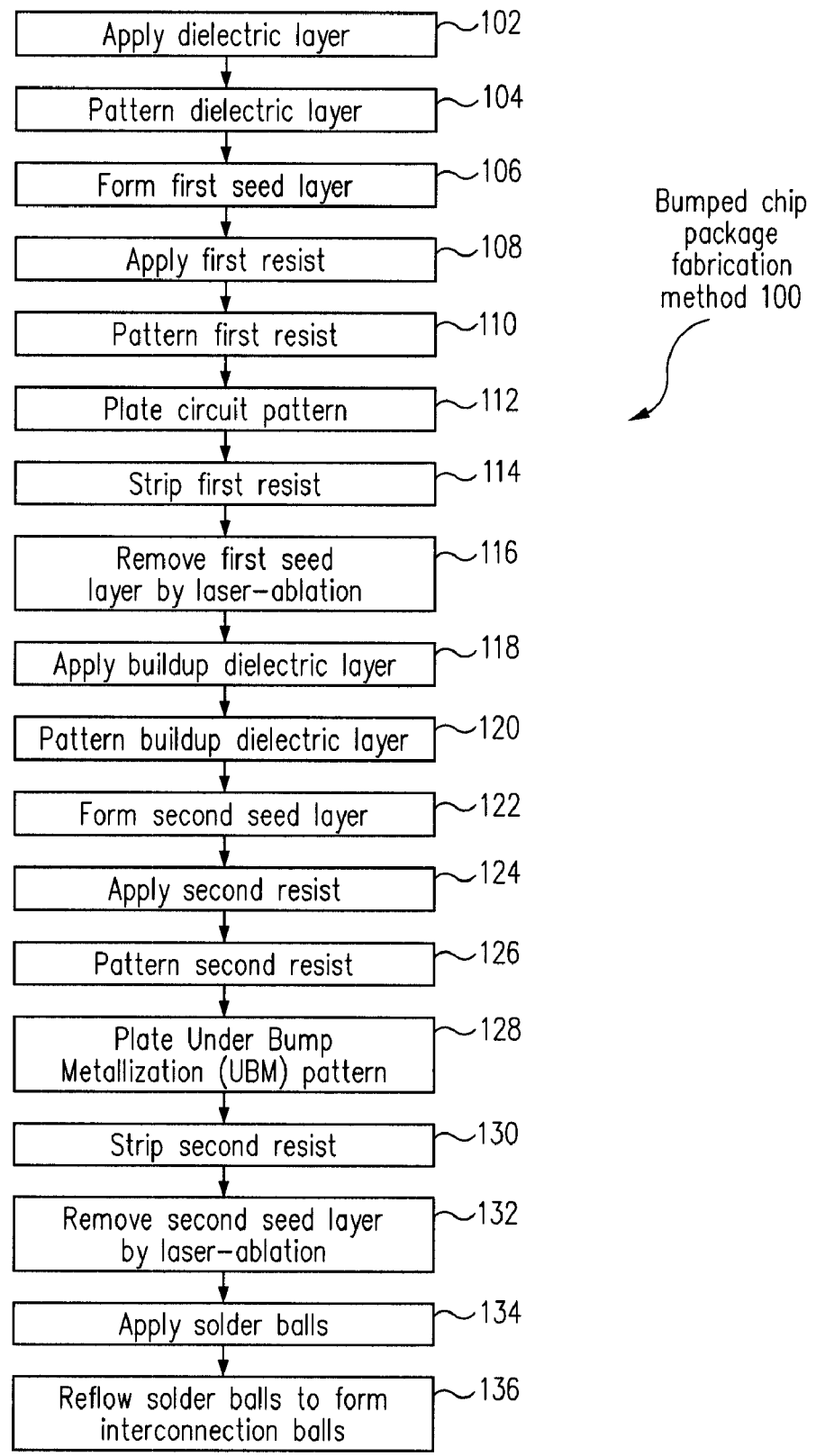
FIG. 1 is a bumped chip package fabrication method in accordance with one embodiment of the present invention.
Figure 2:
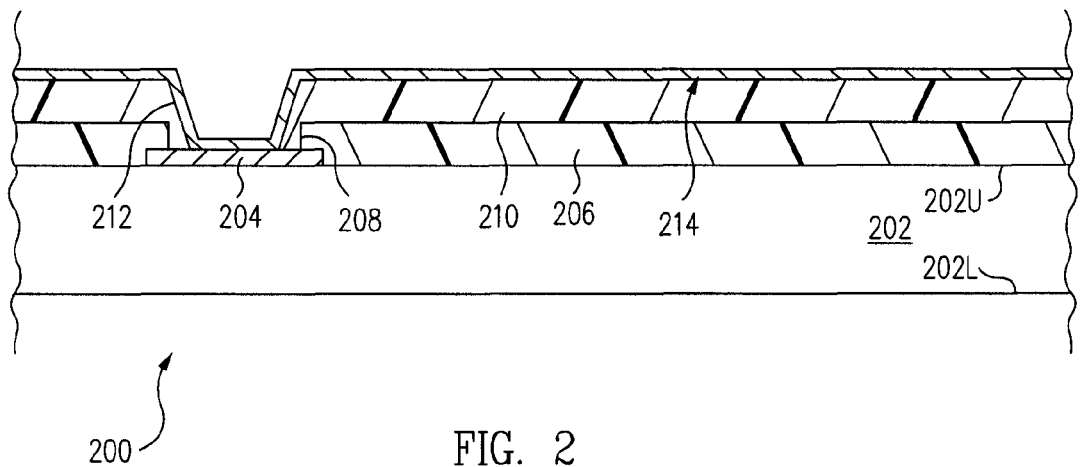
FIG. 2 is a cross-sectional view of a bumped chip package during fabrication in accordance with one embodiment.

FIG. 1 is a bumped chip package fabrication method 100 in accordance with one embodiment of the present invention. FIG. 2 is a cross-sectional view of a bumped chip package 200 during fabrication in accordance with one embodiment.

Bumped chip package 200 includes a substrate 202, e.g., a silicon wafer having a plurality of integrated circuit chips formed therein although other substrates are used in other embodiments. Substrate 202 includes an upper, e.g., first, surface 202U and a lower, e.g., second, surface 202L.

Substrate 202 further includes an electrically conductive substrate terminal 204 on upper surface 202U. Illustratively, substrate terminal 204 is electrically connected to internal electrical circuits and/or devices of substrate 202. Accordingly, substrate terminal 204 is sometimes called a bond pad or input/output (I/O) pad of substrate 202.

Although a single substrate terminal 204 is illustrated and discussed below, in light of this disclosure, those of skill in the art will understand that substrate 202 is formed with a plurality of substrate terminals 204, which are all process simultaneously in the manner set forth below.

Substrate 202 further includes a dielectric passivation layer 206 on upper surface 202U of substrate 202. Passivation layer 206 is patterned to include a passivation layer opening 208 exposing a portion of substrate terminal 204. Passivation layer 206 protects upper surface 202U of substrate 202. At the same time, passivation layer 206 exposes substrate terminal 204 allowing electrical interconnection therewith as discussed further below.

Referring now to FIGS. 1 and 2 together, in an apply dielectric layer operation 102, a dielectric layer 210 is applied. Dielectric layer 210 is applied to passivation layer 206. Dielectric layer 210 fills passivation layer opening 208 and contacts substrate terminal 204. Dielectric layer 210 is a dielectric material, e.g., is polyimide although other dielectric materials are used in other embodiments.

From apply dielectric layer operation 102, flow moves to a pattern dielectric layer operation 104. In pattern dielectric layer operation 104, dielectric layer 210 is patterned to form a dielectric layer opening 212 therein. In accordance with this embodiment, dielectric layer opening 212 extends through passivation layer opening 208. Dielectric layer opening 212 extends entirely through dielectric layer 210 and exposes a portion of substrate terminal 204.

From pattern dielectric layer operation 104, flow moves to a form first seed layer operation 106. In form first seed layer operation 106, a first seed layer 214 is blanket formed. First seed layer 214, sometimes called a redistribution line (RDL) seed layer, is formed directly on and covers dielectric layer 210. Further, first seed layer 214 is formed within and lines dielectric layer opening 212. Further still, first seed layer 214 is formed on and is electrically connected to substrate terminal 204. In one embodiment, first seed layer 214 is formed by plating or sputtering an electrically conductive material such as copper.

Figure 3:
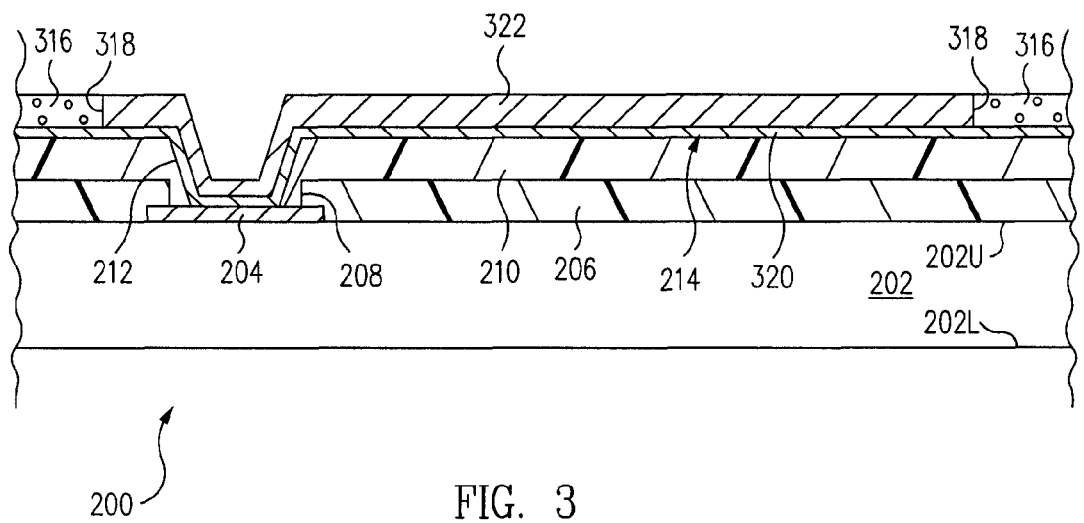
FIGS. 3, 4, 5, 6, 7, 8, 9, 10 are cross-sectional views of the bumped chip package of FIG. 2 at further stages during fabrication in accordance with various embodiments.

FIG. 3 is a cross-sectional view of bumped chip package 200 of FIG. 2 at a further stage during fabrication in accordance with one embodiment. Referring now to FIGS. 1 and 3 together, from form first seed layer operation 106, flow moves to an apply first resist operation 108. In apply first resist operation 108, a dielectric first resist 316 is applied. First resist 316, e.g., a photoresist, entirely covers first seed layer 214.

From apply first resist operation 108, flow moves to a pattern first resist operation 110. In pattern first resist operation 110, first resist 316 is patterned to form a circuit pattern artifact 318 therein. Circuit pattern artifact 318 is a patterned opening extending entirely through first resist 316 and exposing a circuit pattern portion 320 of first seed layer 214. In one embodiment, circuit pattern artifact 318 is a positive image of the circuit pattern to be formed.

Circuit pattern artifact 318 exposes a portion of first seed layer 214 within dielectric layer opening 212. Further, circuit pattern artifact 318 exposes a portion of first seed layer 214 extending from dielectric layer opening 212.

From pattern first resist operation 110, flow moves to a plate circuit pattern operation 112. In plate circuit pattern operation 112, an electrically conductive circuit pattern 322 is plated in circuit pattern artifact 318 using first seed layer 214 as a plating electrode. More particularly, circuit pattern 322 is plated on circuit pattern portion 320 of first seed layer 214. As discussed above, circuit pattern portion 320 was exposed by circuit pattern artifact 318. Illustratively, circuit pattern 322 is a single layer of copper although can be formed of other electrically conductive materials, e.g., can be formed of two or more layers of metal.

Figure 4:
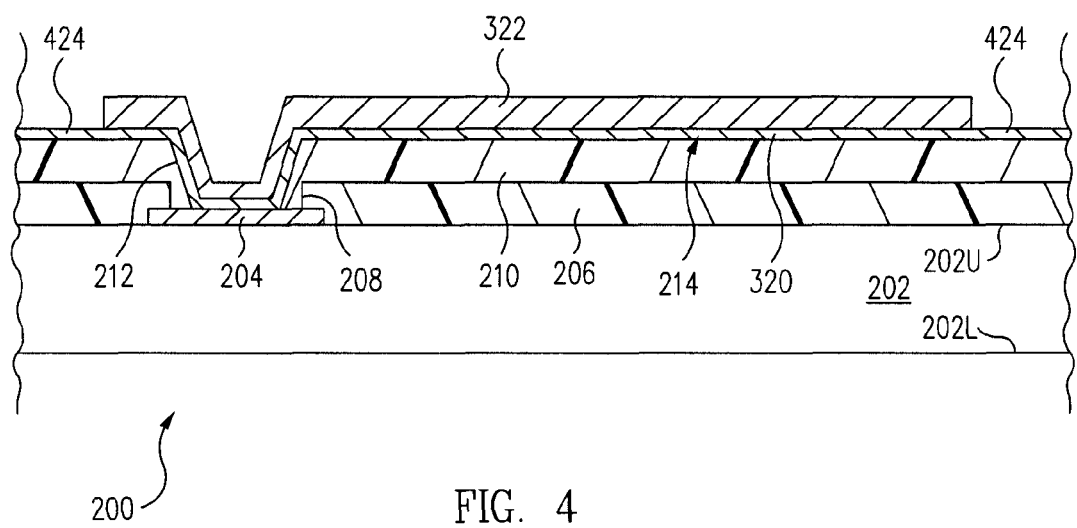

FIG. 4 is a cross-sectional view of bumped chip package 200 of FIG. 3 at a further stage during fabrication in accordance with one embodiment. Referring now to FIGS. 1, 3 and 4 together, from plate circuit pattern operation 112, flow moves to a strip first resist operation 114. In strip first resist operation 114, first resist 316 is stripped, i.e., removed. Accordingly, after removal of first resist 316, an exposed portion 424, sometimes called an un-plated portion, of first seed layer 214 is exposed.

More particularly, first seed layer 214 includes circuit pattern portion 320 covered by circuit pattern 322 and exposed portion 424 uncovered by circuit pattern 322.

Figure 5:
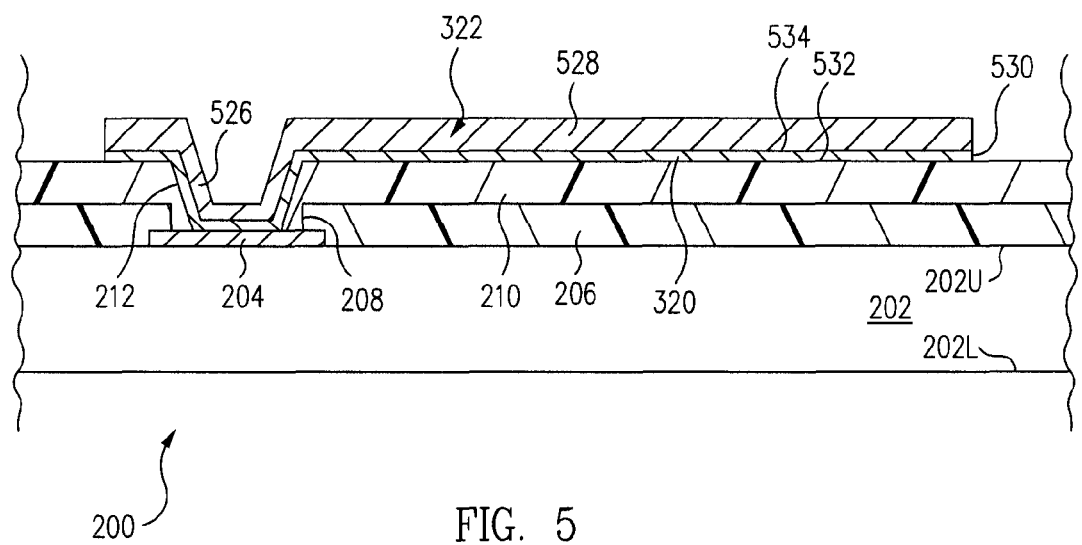

FIG. 5 is a cross-sectional view of bumped chip package 200 of FIG. 4 at a further stage during fabrication in accordance with one embodiment. Referring now to FIGS. 1, 4 and 5 together, from strip first resist operation 114, flow moves to a remove first seed layer by laser-ablation operation 116. In remove first seed layer by laser-ablation operation 116, exposed portion 424 of first seed layer 214 is removed, i.e., laser-ablated, by laser-ablation.

During this laser-ablation process, a laser beam is directed at exposed portion 424 of first seed layer 214 and moved. The laser beam laser-ablates and entirely removes exposed portion 424 of first seed layer 214. Of course, circuit pattern portion 320 of first seed layer 214 remains between circuit pattern 322 and dielectric layer 210.

Circuit pattern 322 includes a plurality of electrically conductive features. These features include an electrically conductive via 526 extending through dielectric layer opening 212 and being electrically connected to substrate terminal 204 through circuit pattern portion 320 of first seed layer 214. These features further include an electrically conductive extension 528 electrically connected to and integral with via 526. Although two examples of features of circuit pattern 322 are illustrated and discussed, in light of this disclosure, those of skill in the art will understand that the features can include traces, e.g., copper lines, lands, and other features.

By using a laser-ablation process to remove exposed portion 424 of first seed layer 214, a chemical etching process is avoided. Accordingly, the generation of hazardous waste from a chemical etching process is avoided thus eliminating the need to treat or dispose of the chemical etching hazardous waste.

In one embodiment, exposed portion 424 of first seed layer 214 is vaporized during the laser-ablation process. The vaporized exposed portion 424 is removed by a vacuum process, recaptured, and recycled. In this manner, the material of exposed portion 424 is recycled thus reducing costs and the impact upon the environment.

Further, by using a laser-ablation process to remove exposed portion 424 of first seed layer 214, etching of circuit pattern 322 is avoided. Accordingly, circuit pattern width erosion and undercut of circuit pattern 322 associated with a chemical etching process are avoided.

In one embodiment, after laser-ablation removal of exposed portion 424 of first seed layer 214, the remaining circuit pattern portion 320 of first seed layer 214 is formed with perpendicular sidewalls 530. More particularly, circuit pattern portion 320 includes a lower, e.g., first, surface 532 on dielectric layer 210 and an upper, e.g., second, surface 534 upon which circuit pattern 322 is plated. Perpendicular sidewalls 530 extend perpendicularly between lower surface 532 and upper surface 534.

Although the terms parallel, perpendicular, and similar terms are set forth herein, it is to be understood that the features may not be exactly parallel, and perpendicular, but only substantially parallel, and perpendicular to within accepted manufacturing tolerances.

Further, by using a laser-ablation process to remove exposed portion 424 of first seed layer 214, circuit pattern 322 can be formed to have a minimum distance between features, e.g., traces, lands, and vias, of circuit pattern 322. More particularly, the requirement to provide a minimum spacing between features of circuit pattern 322 to allow sufficient contact between first seed layer 214 and the chemical etching solution is eliminated. Accordingly, circuit pattern 322 can be formed with a minimum inner feature spacing, i.e., a minimum spacing between features of circuit pattern 322.

Figure 6:
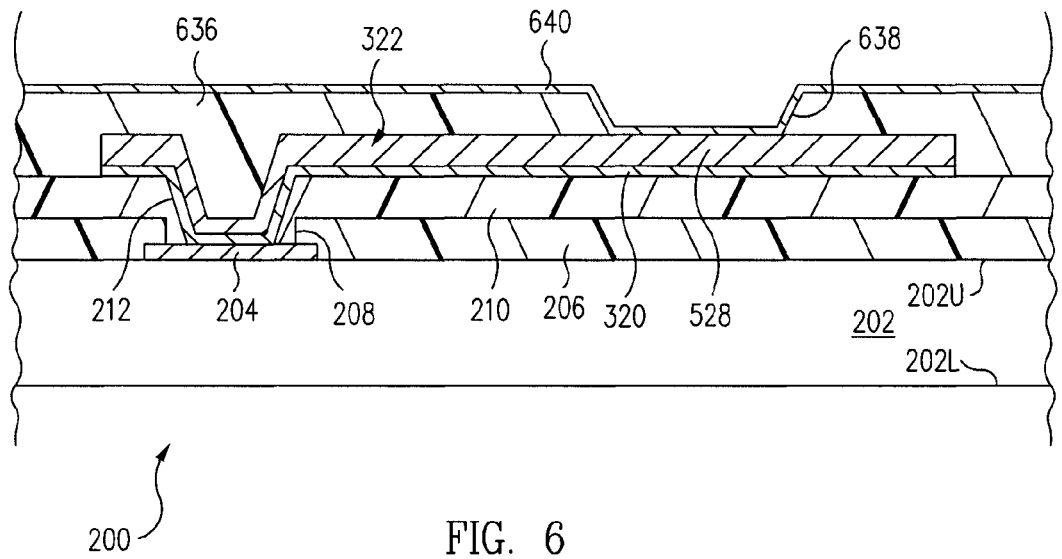

FIG. 6 is a cross-sectional view of bumped chip package 200 of FIG. 5 at a further stage during fabrication in accordance with one embodiment. Referring now to FIGS. 1 and 6 together, from remove first seed layer by laser-ablation operation 116, flow moves to an apply buildup dielectric layer operation 118. In apply buildup dielectric layer operation 118, a buildup dielectric layer 636 is applied. Buildup dielectric layer 636 is applied to circuit pattern 322 and the exposed portion of dielectric layer 210. Buildup dielectric layer 636 is a dielectric material, e.g., is polyimide although other dielectric materials are used in other embodiments.

From apply buildup dielectric layer operation 118, flow moves to a pattern buildup dielectric layer operation 120. In pattern buildup dielectric layer operation 120, buildup dielectric layer 636 is patterned to form a buildup dielectric layer opening 638 therein. In accordance with this embodiment, buildup dielectric layer opening 638 extends entirely through buildup dielectric layer 636 and exposes a portion of extension 528 of circuit pattern 322.

From pattern buildup dielectric layer operation 120, flow moves to a form second seed layer operation 122. In form second seed layer operation 122, a second seed layer 640 is blanket formed. Second seed layer 640, sometimes called an Under Bump Metallization (UBM) seed layer, is formed directly on and covers buildup dielectric layer 636. Further, second seed layer 640 is formed within and lines buildup dielectric layer opening 638. Further still, second seed layer 640 is on and is electrically connected to extension 528 of circuit pattern 322. In one embodiment, second seed layer 640 is formed by plating or sputtering an electrically conductive material such as copper.

Figure 7:
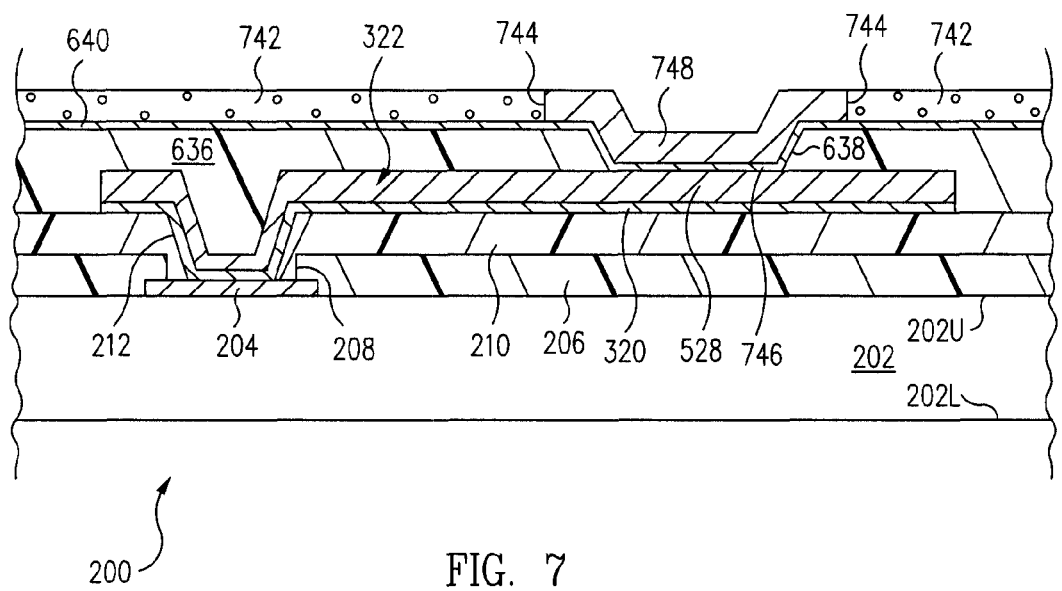

FIG. 7 is a cross-sectional view of bumped chip package 200 of FIG. 6 at a further stage during fabrication in accordance with one embodiment. Referring now to FIGS. 1 and 7 together, from form second seed layer operation 122, flow moves to an apply second resist operation 124. In apply second resist operation 124, a dielectric second resist 742 is applied. Second resist 742, e.g., a photoresist, entirely covers second seed layer 640.

From apply second resist operation 124, flow moves to a pattern second resist operation 126. In pattern second resist operation 126, second resist 742 is patterned to form a UBM pattern artifact 744 therein. UBM pattern artifact 744 is a patterned opening extending entirely through second resist 742 and exposing a UBM pattern portion 746 of second seed layer 640. In one embodiment, UBM pattern artifact 744 is a positive image of the UBM pattern to be formed.

From pattern second resist operation 126, flow moves to a plate Under Bump Metallization (UBM) pattern operation 128. In plate UBM pattern operation 128, an electrically conductive UBM pattern 748 is plated in UBM pattern artifact 744 using second seed layer 640 as a plating electrode. More particularly, UBM pattern 748 is plated on UBM pattern portion 746 of second seed layer 640. As discussed above, UBM pattern portion 746 was exposed by UBM pattern artifact 744. Illustratively, UBM pattern 748 is a single layer of nickel or gold although can be formed of other electrically conductive materials, e.g., can be formed of two or more layers of metal such as a nickel and gold bi-layer. In one embodiment, UBM pattern 748 provides a diffusion barrier between the overlying solder of an interconnection ball and the underlying copper or other material of extension 528 as will be more readily apparent below.

Figure 8:
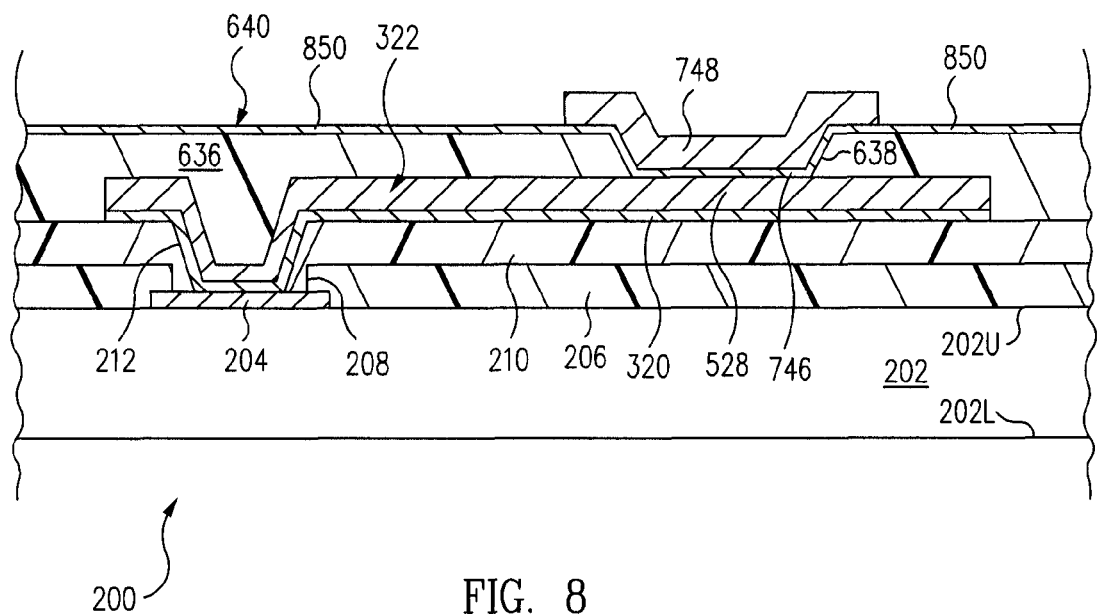

FIG. 8 is a cross-sectional view of bumped chip package 200 of FIG. 7 at a further stage during fabrication in accordance with one embodiment. Referring now to FIGS. 1, 7 and 8 together, from plate UBM pattern operation 128, flow moves to a strip second resist operation 130. In strip second resist operation 130, second resist 742 is stripped, i.e., removed. Accordingly, after removal of second resist 742, an exposed portion 850, sometimes called an un-plated portion, of second seed layer 640 is exposed.

More particularly, second seed layer 640 includes UBM pattern portion 746 covered by UBM pattern 748 and exposed portion 850 uncovered by UBM pattern 748.

Figure 9:
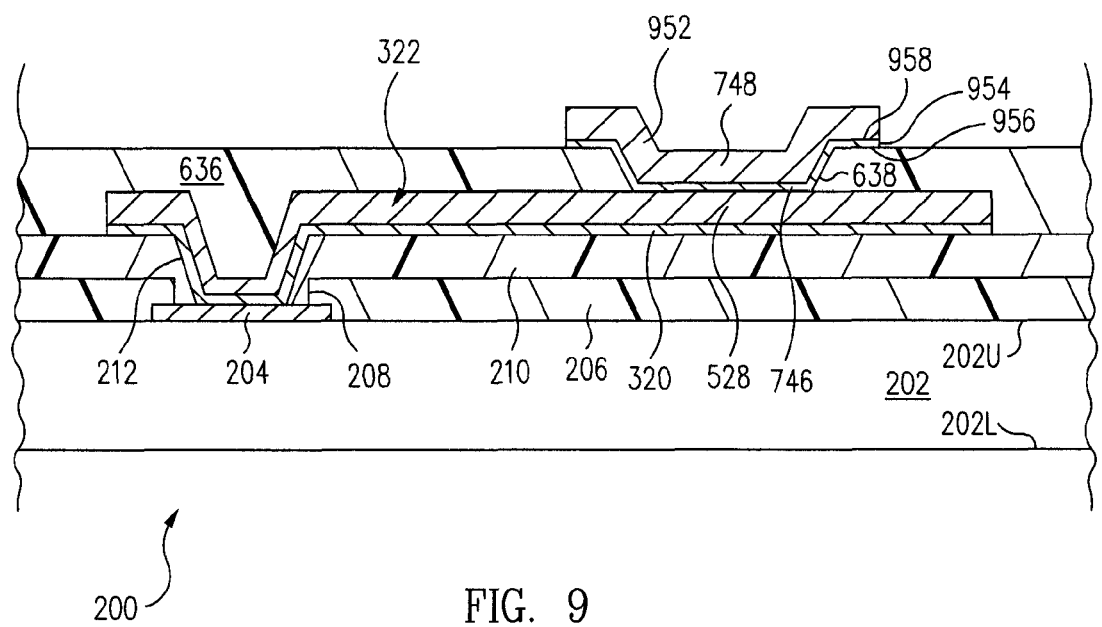

FIG. 9 is a cross-sectional view of bumped chip package 200 of FIG. 8 at a further stage during fabrication in accordance with one embodiment. Referring now to FIGS. 1, 8 and 9 together, from strip second resist operation 130, flow moves to a remove second seed layer by laser-ablation operation 132. In remove second seed layer by laser-ablation operation 132, exposed portion 850 of second seed layer 640 is removed, i.e., laser-ablated, by laser-ablation.

During this laser-ablation process, a laser beam is directed at exposed portion 850 of second seed layer 640 and moved. The laser beam laser-ablates and entirely removes exposed portion 850 of second seed layer 640. Of course, UBM pattern portion 746 of second seed layer 640 remains between UBM pattern 748 and buildup dielectric layer 636 and extension 528 of circuit pattern 322.

UBM pattern 748 defines a solder ball land. UBM pattern 748 includes an electrically conductive via 952 extending through buildup dielectric layer opening 638 and being electrically connected to extension 528 of circuit pattern 322 through UBM pattern portion 746 of second seed layer 640. UBM pattern 748 further extends outwards from buildup dielectric layer opening 638 and on to the upper surface of buildup dielectric layer 636 around the periphery of buildup dielectric layer opening 638. Although a single solder ball land of UBM pattern 748 is illustrated and discussed, in light of this disclosure, those of skill in the art will understand that UBM pattern 748 includes a plurality of similar solder ball lands.

By using a laser-ablation process to remove exposed portion 850 of second seed layer 640, a chemical etching process is avoided. Accordingly, the generation of hazardous waste from a chemical etching process is avoided thus eliminating the need to treat or dispose of the chemical etching hazardous waste.

In one embodiment, exposed portion 850 of second seed layer 640 is vaporized during the laser-ablation process, removed by a vacuum process, recaptured, and recycled. In this manner, the material of exposed portion 850 is recycled thus reducing costs and the impact upon the environment.

Further, by using a laser-ablation process to remove exposed portion 850 of second seed layer 640, etching of UBM pattern 748 is avoided. Accordingly, UBM pattern width erosion and undercut of UBM pattern 748 associated with a chemical etching process are avoided.

In one embodiment, after laser-ablation removal of exposed portion 850 of second seed layer 640, the remaining UBM pattern portion 746 of second seed layer 640 is formed with perpendicular sidewalls 954. More particularly, UBM pattern portion 746 includes a lower, e.g., first, surface 956 on buildup dielectric layer 636 and an upper, e.g., second, surface 958 upon which UBM pattern 748 is plated. Perpendicular sidewalls 954 extend perpendicularly between lower surface 956 and upper surface 958.

Further, by using a laser-ablation process to remove exposed portion 850 of second seed layer 640, UBM pattern 748 can be formed to have a minimum distance between features, e.g., solder ball lands. More particularly, the requirement to provide a minimum spacing between features of UBM pattern 748 to allow sufficient contact with the chemical etching solution is eliminated. Accordingly, UBM pattern 748 can be formed with a minimum inner feature spacing.

Figure 10:
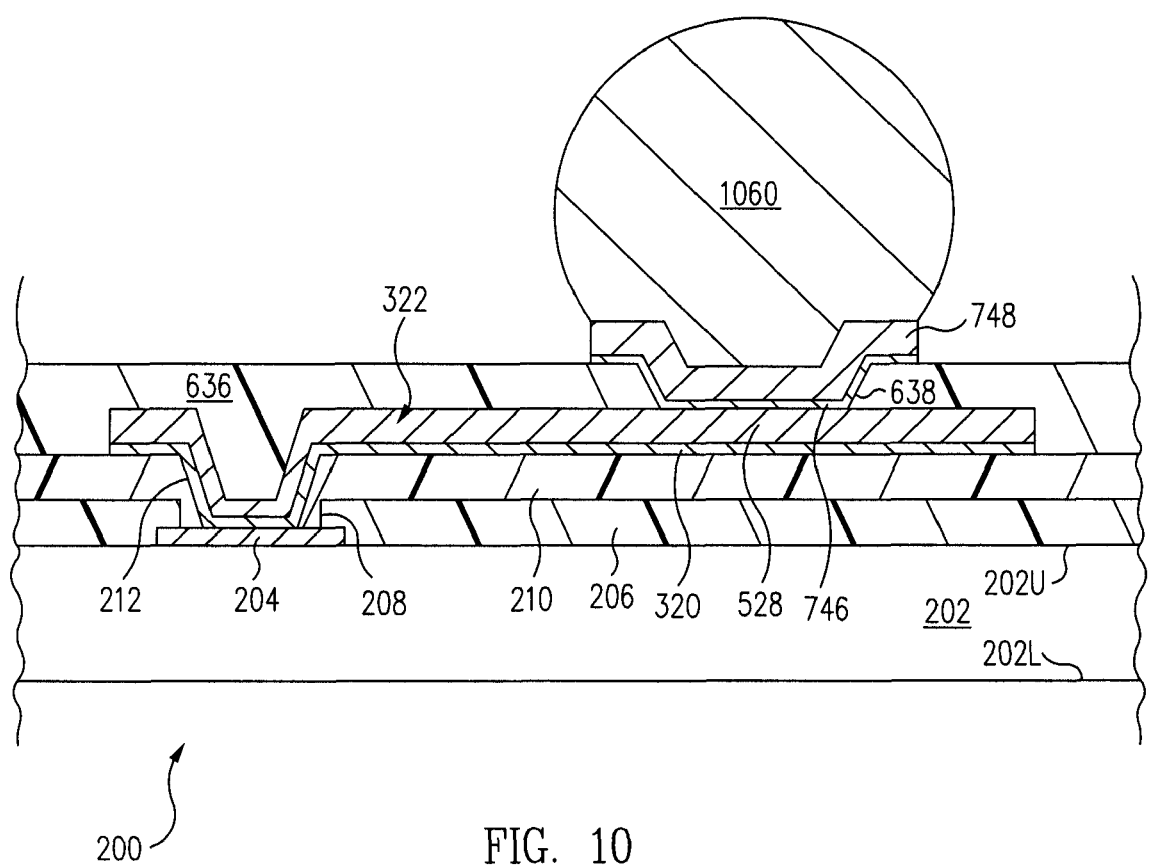

FIG. 10 is a cross-sectional view of bumped chip package 200 of FIG. 9 at a further stage during fabrication in accordance with one embodiment. Referring now to FIGS. 1 and 10 together, from remove second seed layer by laser-ablation operation 132, flow moves to an apply solder balls operation 134. In apply solder balls operation 134, solder balls, e.g., pieces of solder, are applied to UBM pattern 748, and specifically, on lands of UBM pattern 748. In one embodiment, a flux is applied to UBM pattern 748 and the solder balls are placed in the flux upon the respective lands of UBM pattern 748. Although one example of applying solder balls is set forth herein, in light of this disclosure, those of skill in the art will understand that solder balls can be applied using any one of a number of techniques.

From apply solder balls operation 134, flow moves to a reflow solder balls to form interconnection balls operation 136. In reflow solder balls to form interconnection balls operation 136, the solder balls applied in apply solder balls operation 134 are reflowed to form interconnection balls 1060. More particularly, bumped chip package 200 is heated to melt the solder balls and fuse the solder balls to UBM pattern 748 and then cooled to form interconnection balls 1060 physically and electrically connected to UBM pattern 748 as illustrated in FIG. 10.

In the above manner, the pattern of substrate terminals 204 is redistributed to the pattern of interconnection balls 1060. Further, interconnection balls 1060 can be reflowed to mount bumped chip package 200 to a larger substrate such as a printed circuit motherboard.

Figure 11:
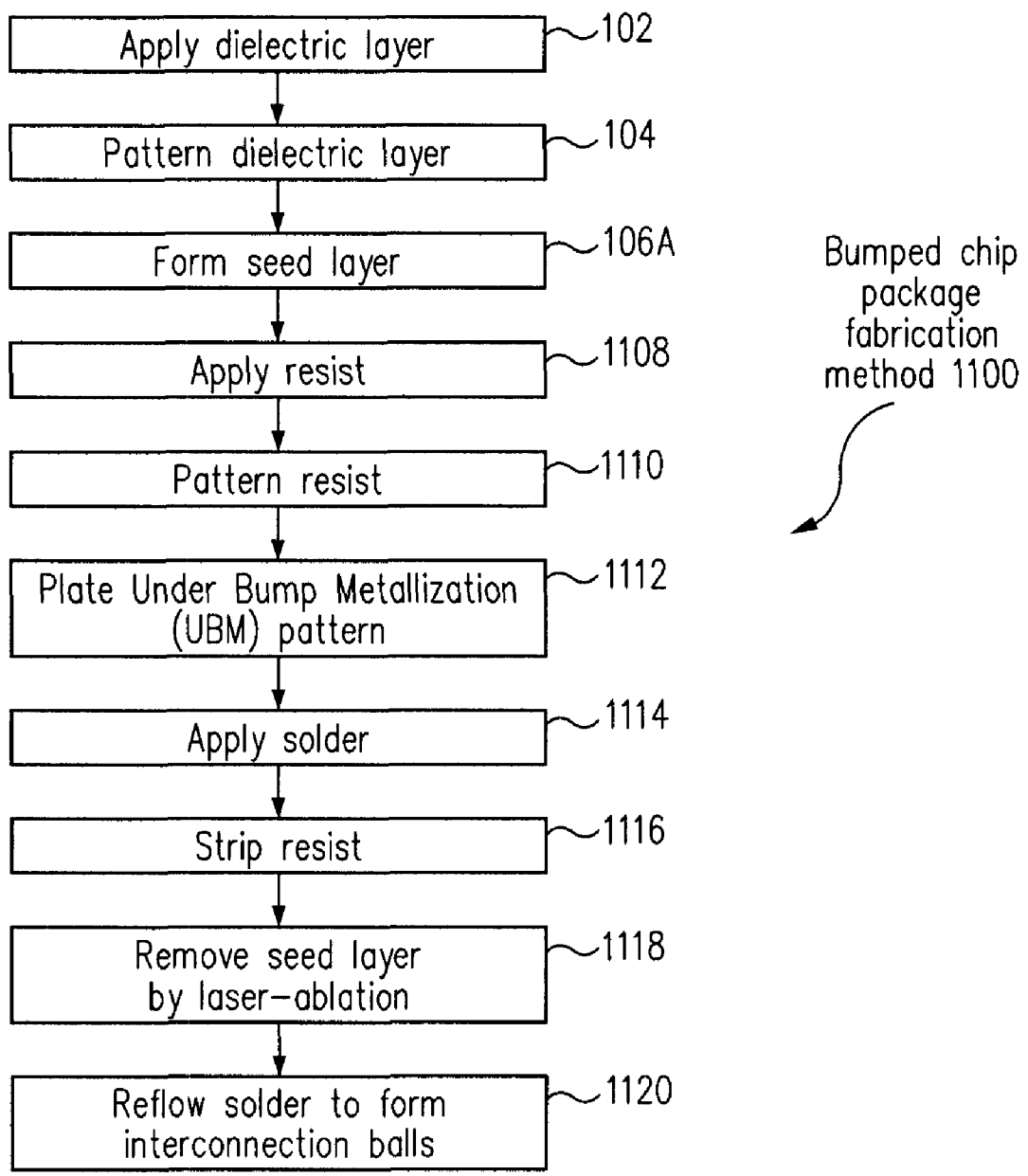
FIG. 11 is a bumped chip package fabrication method in accordance with another embodiment of the present invention.
Figure 12:
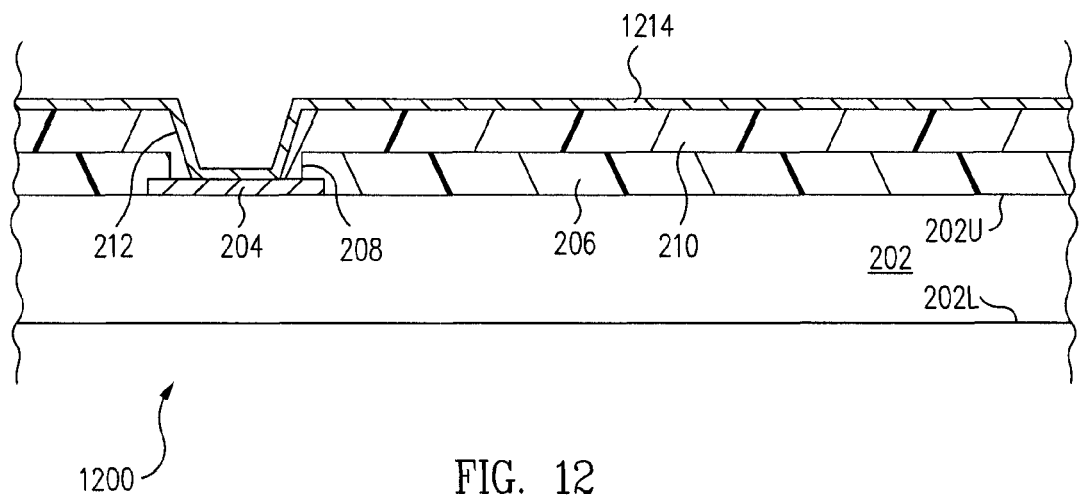
FIG. 12 is a cross-sectional view of a bumped chip package during fabrication in accordance with one embodiment.

FIG. 11 is a bumped chip package fabrication method 1100 in accordance with another embodiment of the present invention. FIG. 12 is a cross-sectional view of a bumped chip package 1200 during fabrication in accordance with one embodiment. Bumped chip package 1200 of FIG. 12 is similar to bumped chip package 200 of FIG. 2 and only the significant differences between bumped chip packages 1200, 200 are discussed below.

Referring now to FIGS. 11 and 12 together, bumped chip package 1200 includes substrate 202 having upper surface 202U, lower surface 202L, and substrate terminal 204. Substrate 202 further includes passivation layer 206 having passivation layer opening 208 exposing a portion of substrate terminal 204.

In apply dielectric layer operation 102, a dielectric layer 210 is applied in manner similar to that discussed above regarding apply dielectric layer operation 102 of FIG. 1 and so is not repeated for simplicity.

From apply dielectric layer operation 102, flow moves to pattern dielectric layer operation 104. In pattern dielectric layer operation 104, dielectric layer 210 is patterned to form dielectric layer opening 212 therein in manner similar to that discussed above regarding pattern dielectric layer operation 104 of FIG. 1 and so is not repeated for simplicity.

From pattern dielectric layer operation 104, flow moves to a form seed layer operation 106A. In form seed layer operation 106A, a seed layer 1214 is blanket formed. Seed layer 1214 of FIG. 12 is similar to first seed layer 214 of FIG. 2 and so is not discussed in detail for simplicity.

Figure 13:
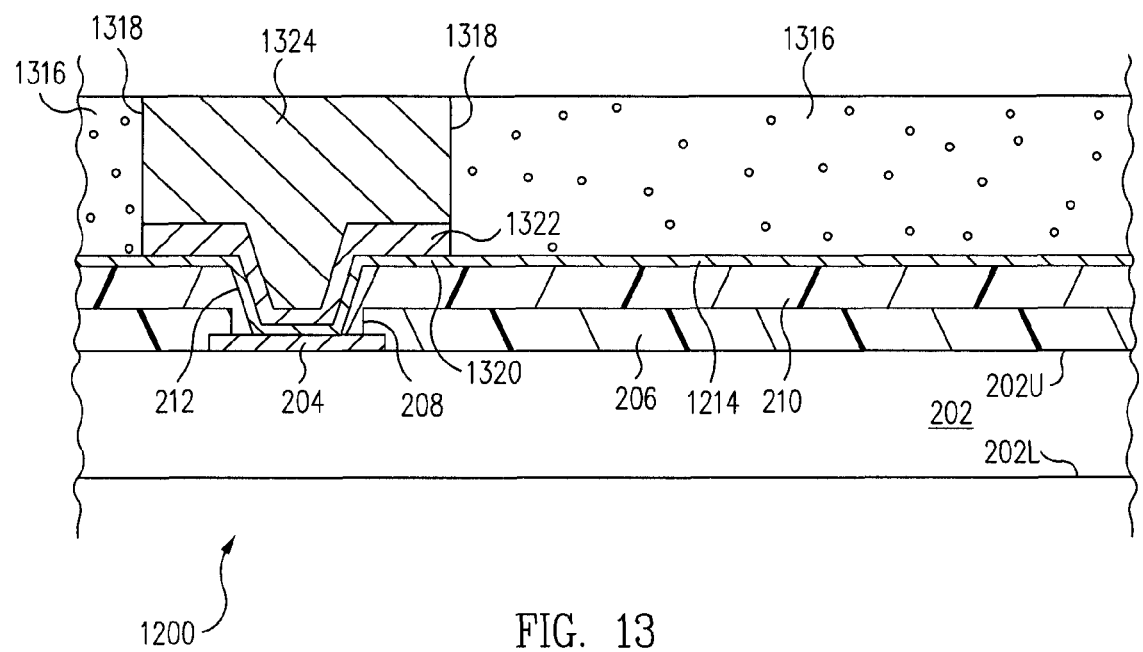
FIGS. 13, 14, 15, 16 are cross-sectional views of the bumped chip package of FIG. 12 at further stages during fabrication in accordance with various embodiments.

FIG. 13 is a cross-sectional view of bumped chip package 1200 of FIG. 12 at a further stage during fabrication in accordance with one embodiment. Referring now to FIGS. 11 and 13 together, from form seed layer operation 106A, flow moves to an apply resist operation 1108. In apply resist operation 1108, a dielectric resist 1316 is applied. Resist 1316, e.g., a photoresist, entirely covers seed layer 1214.

From apply resist operation 1108, flow moves to a pattern resist operation 1110. In pattern resist operation 1110, resist 1316 is patterned to form an UBM pattern artifact 1318 therein. UBM pattern artifact 1318 is a patterned opening extending entirely through resist 1316 and exposing a UBM pattern portion 1320 of seed layer 1214. In one embodiment, UBM pattern artifact 1318 is a positive image of the UBM pattern to be formed.

UBM pattern artifact 1318 exposes a portion of seed layer 1214 within dielectric layer opening 212. Further, UBM pattern artifact 1318 exposes a portion of seed layer 1214 extending outwards from dielectric layer opening 212 and on to the upper surface of dielectric layer 210 around the periphery of dielectric layer opening 212.

From pattern resist operation 1110, flow moves to a plate Under Bump Metallization (UBM) pattern operation 1112. In plate UBM pattern operation 1112, an electrically conductive UBM pattern 1322 is plated in UBM pattern artifact 1318 using seed layer 1214 as a plating electrode. More particularly, UBM pattern 1322 is plated on UBM pattern portion 1320 of seed layer 1214. As discussed above, UBM pattern portion 1320 was exposed by UBM pattern artifact 1318. Illustratively, UBM pattern 1322 is a single layer of nickel or gold although can be formed of other electrically conductive materials, e.g., can be formed of two or more layers of metal such as a nickel and gold bi-layer.

UBM pattern 1322 only partially fills UBM pattern artifact 1318 such that a space remains within UBM pattern artifact 1318 above UBM pattern 1322. This space is filled with solder in an apply solder operation 1114 as discussed below.

From plate UBM pattern operation 1112, flow moves to apply solder operation 1114. In apply solder operation 1114, solder 1324 is applied. More particularly, solder 1324 is applied to fill the remaining space within UBM pattern artifact 1318 above UBM pattern 1322. Solder 1324 is applied using any one of a number of techniques, e.g., is plated, screened, or applied using other solder application technique.

Figure 14:
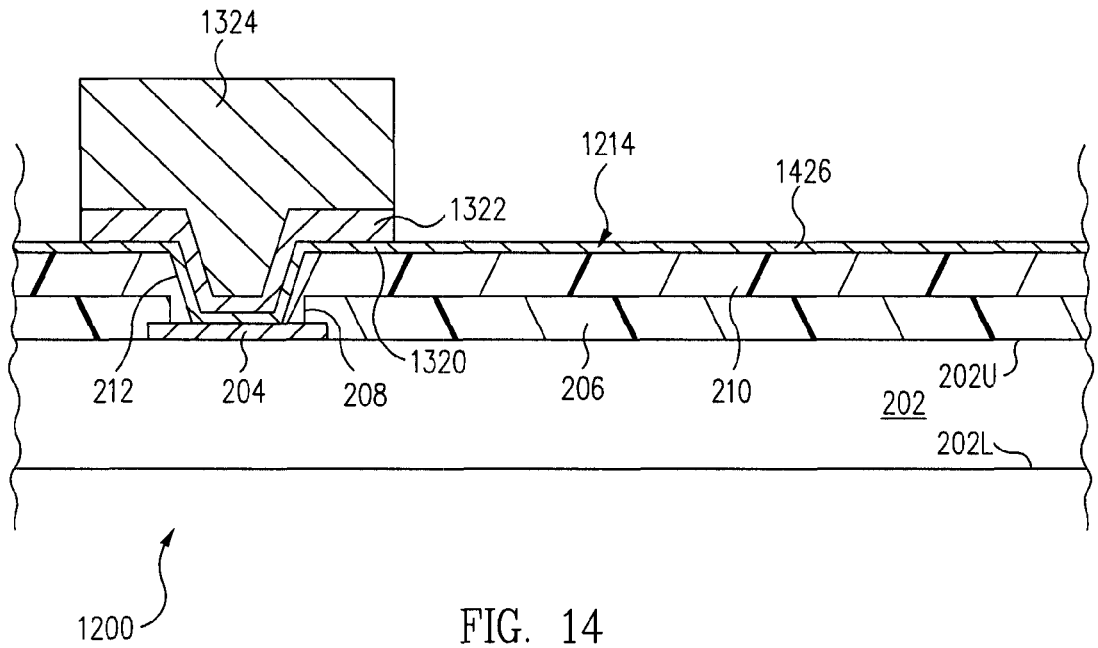

FIG. 14 is a cross-sectional view of bumped chip package 1200 of FIG. 13 at a further stage during fabrication in accordance with one embodiment. Referring now to FIGS. 11, 13 and 14 together, from apply solder operation 1114, flow moves to a strip resist operation 1116. In strip resist operation 1116, resist 1316 is stripped, i.e., removed. Accordingly, after removal of resist 1316, an exposed portion 1426, sometimes called an un-plated portion, of seed layer 1214 is exposed.

More particularly, seed layer 1214 includes UBM pattern portion 1320 covered by UBM pattern 1322 and exposed portion 1426 uncovered by UBM pattern 1322.

Figure 15:
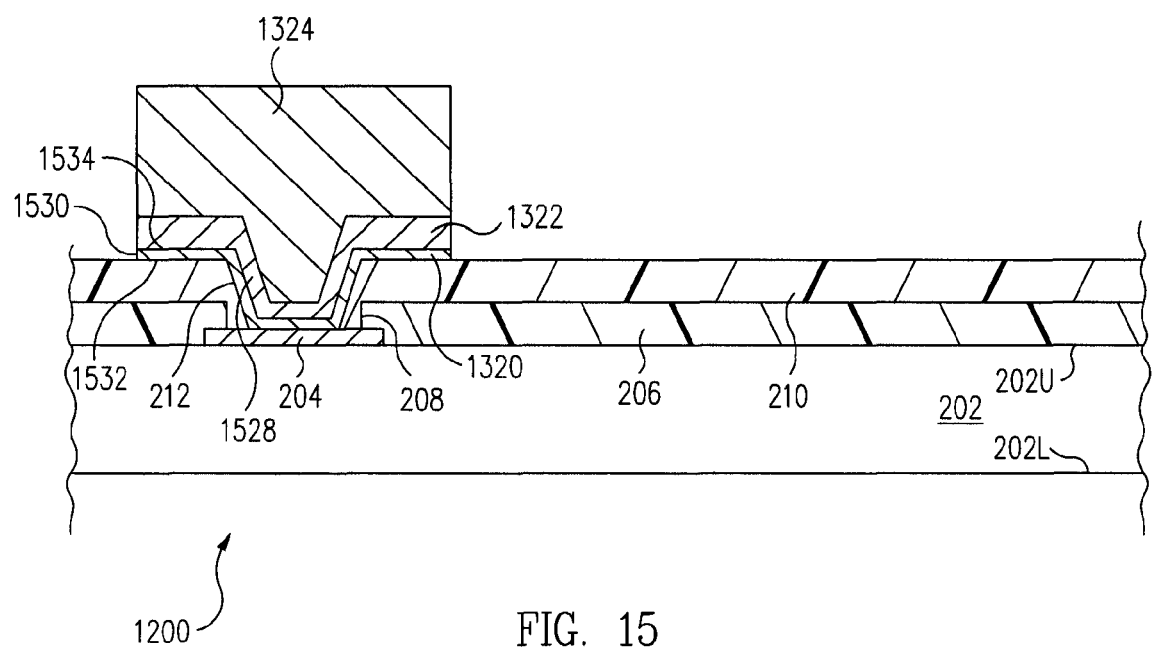

FIG. 15 is a cross-sectional view of bumped chip package 1200 of FIG. 14 at a further stage during fabrication in accordance with one embodiment. Referring now to FIGS. 11, 14 and 15 together, from strip resist operation 1116, flow moves to a remove seed layer by laser-ablation operation 1118. In remove seed layer by laser-ablation operation 1118, exposed portion 1426 of seed layer 1214 is removed, i.e., laser-ablated, by laser-ablation.

During this laser-ablation process, a laser beam is directed at exposed portion 1426 of seed layer 1214 and moved. The laser beam laser-ablates and entirely removes exposed portion 1426 of seed layer 1214. Of course, UBM pattern portion 1320 of seed layer 1214 remains between UBM pattern 1322 and dielectric layer 210.

UBM pattern 1322 defines a solder ball land and solder 1324 is on this land. UBM pattern 1322 includes an electrically conductive via 1528 extending through dielectric layer opening 212 and being electrically connected to substrate terminal 204 through UBM pattern portion 1320 of seed layer 1214. UBM pattern 1322 further extends outwards from dielectric layer opening 212 and on to the upper surface of dielectric layer 210 around the periphery of dielectric layer opening 212. Although a single solder ball land of UBM pattern 1322 and associated solder 1324 are illustrated and discussed, in light of this disclosure, those of skill in the art will understand that UBM pattern 1322 includes a plurality of similar solder ball lands having respective solder 1324 thereon.

By using a laser-ablation process to remove exposed portion 1426 of seed layer 1214, a chemical etching process is avoided. Accordingly, the generation of hazardous waste from a chemical etching process is avoided thus eliminating the need to treat or dispose of the chemical etching hazardous waste.

In one embodiment, exposed portion 1426 of seed layer 1214 is vaporized during the laser-ablation process, removed by a vacuum process, recaptured, and recycled. In this manner, the material of exposed portion 1426 is recycled thus reducing costs and the impact upon the environment.

Further, by using a laser-ablation process to remove exposed portion 1426 of seed layer 1214, etching of UBM pattern 1322 is avoided. Accordingly, UBM pattern width erosion and undercut of UBM pattern 1322 associated with a chemical etching process are avoided.

In one embodiment, after laser-ablation removal of exposed portion 1426 of seed layer 1214, the remaining UBM pattern portion 1320 of seed layer 1214 is formed with perpendicular sidewalls 1530. More particularly, circuit pattern portion 1320 includes a lower, e.g., first, surface 1532 on dielectric layer 210 and an upper, e.g., second, surface 1534 upon which UBM pattern 1322 is plated. Perpendicular sidewalls 1530 extend perpendicularly between lower surface 1532 and upper surface 1534.

Further, by using a laser-ablation process to remove exposed portion 1426 of seed layer 1214, UBM pattern 1322 can be formed to have a minimum distance between features, e.g., solder ball lands. More particularly, the requirement to provide a minimum spacing between features of UBM pattern 1322 to allow sufficient contact between seed layer 1214 and the chemical etching solution is eliminated. Accordingly, UBM pattern 1322 can be formed with a minimum inner feature spacing.

Figure 16:
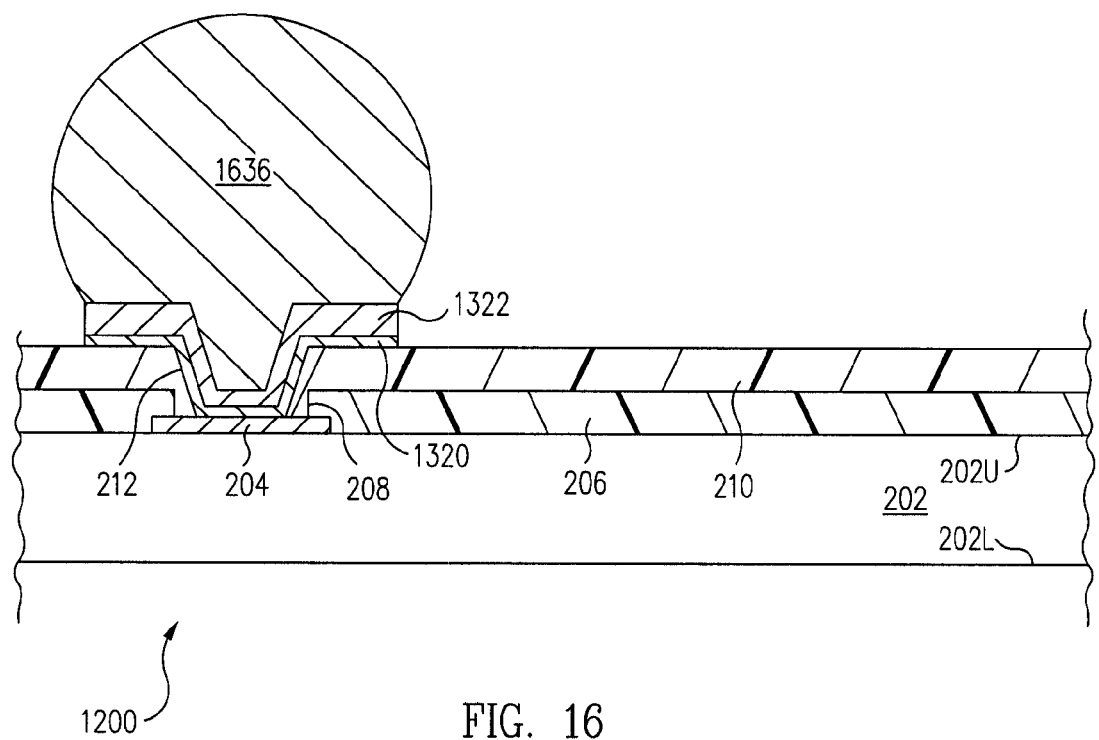

FIG. 16 is a cross-sectional view of bumped chip package 1200 of FIG. 15 at a further stage during fabrication in accordance with one embodiment. Referring now to FIGS. 11, 15 and 16 together, from remove seed layer by laser-ablation operation 1118, flow moves to a reflow solder to form interconnection balls operation 1120. In reflow solder to form interconnection balls operation 1120, solder 1324 applied in apply solder operation 1114 is reflowed to form interconnection balls 1636. More particularly, bumped chip package 1200 is heated to melt solder 1324 and fuse solder 1324 to UBM pattern 1322 and then cooled to form interconnection balls 1636 physically and electrically connected to UBM pattern 1322 as illustrated in FIG. 16.

In the above manner, interconnection balls 1636, i.e., means for physically and electrically connecting bumped chip package 1200, are formed, aligned with, and electrically connected to substrate terminals 204. Interconnection balls 1636 are reflowed to mount bumped chip package 1200 to a larger substrate such as a printed circuit motherboard.

Figure 17:
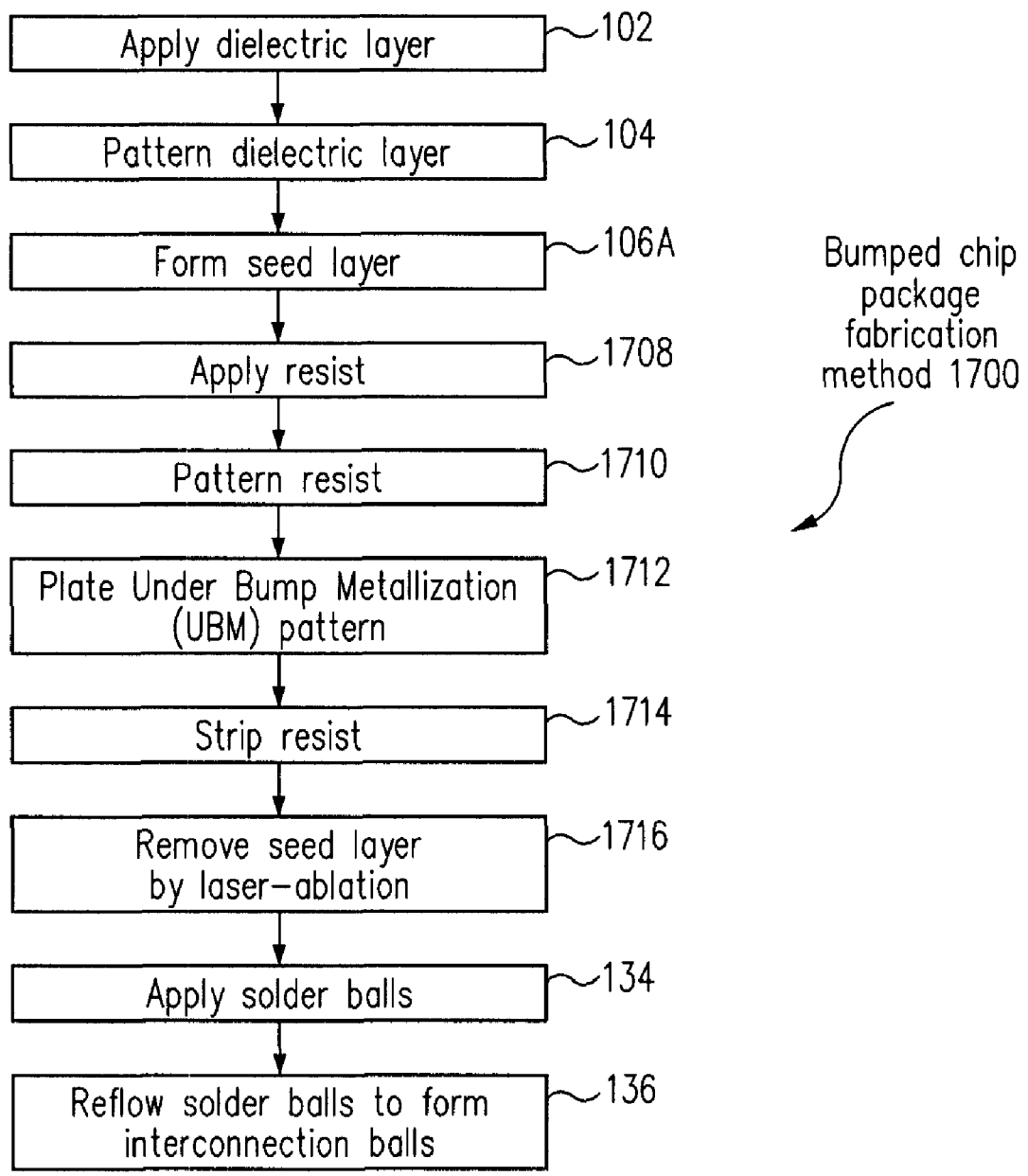
FIG. 17 is a bumped chip package fabrication method in accordance with another embodiment of the present invention.
Figure 18:
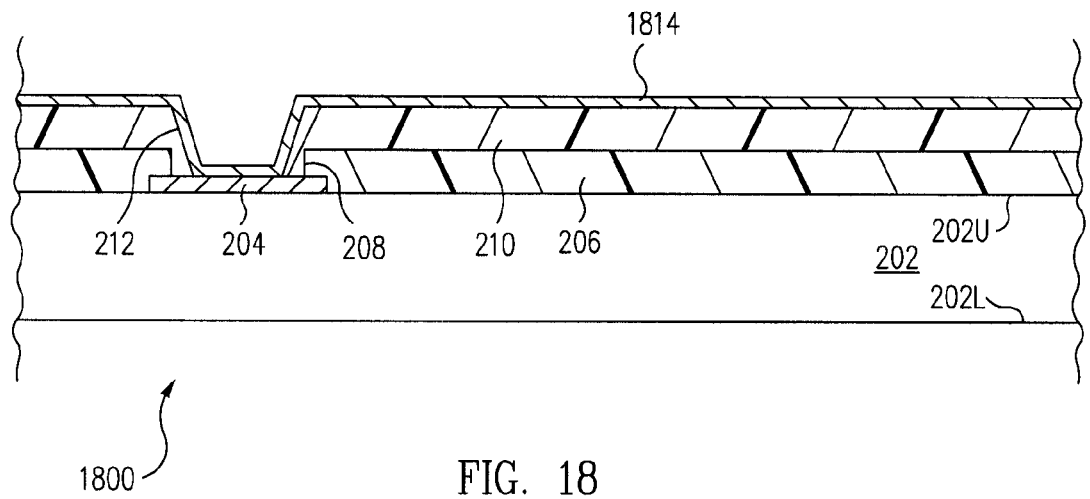
FIG. 18 is a cross-sectional view of a bumped chip package during fabrication in accordance with one embodiment.

FIG. 17 is a bumped chip package fabrication method 1700 in accordance with another embodiment of the present invention. FIG. 18 is a cross-sectional view of a bumped chip package 1800 during fabrication in accordance with one embodiment. Bumped chip package 1800 of FIG. 18 is similar to bumped chip package 200 of FIG. 2 and only the significant differences between bumped chip packages 1800, 200 are discussed below.

Referring now to FIGS. 17 and 18 together, bumped chip package 1800 includes substrate 202 having upper surface 202U, lower surface 202L, and substrate terminal 204. Substrate 202 further includes passivation layer 206 having passivation layer opening 208 exposing a portion of substrate terminal 204.

In apply dielectric layer operation 102, a dielectric layer 210 is applied in a manner similar to that discussed above regarding apply dielectric layer operation 102 of FIG. 1 and so is not repeated for simplicity.

From apply dielectric layer operation 102, flow moves to pattern dielectric layer operation 104. In pattern dielectric layer operation 104, dielectric layer 210 is patterned to form a dielectric layer opening 212 therein in manner similar to that discussed above regarding pattern dielectric layer operation 104 of FIG. 1 and so is not repeated for simplicity.

From pattern dielectric layer operation 104, flow moves to a form seed layer operation 106A. In form seed layer operation 106A, a seed layer 1814 is blanket formed. Seed layer 1814 of FIG. 18 is similar to first seed layer 214 of FIG. 2 and so is not discussed in detail for simplicity.

Figure 19:
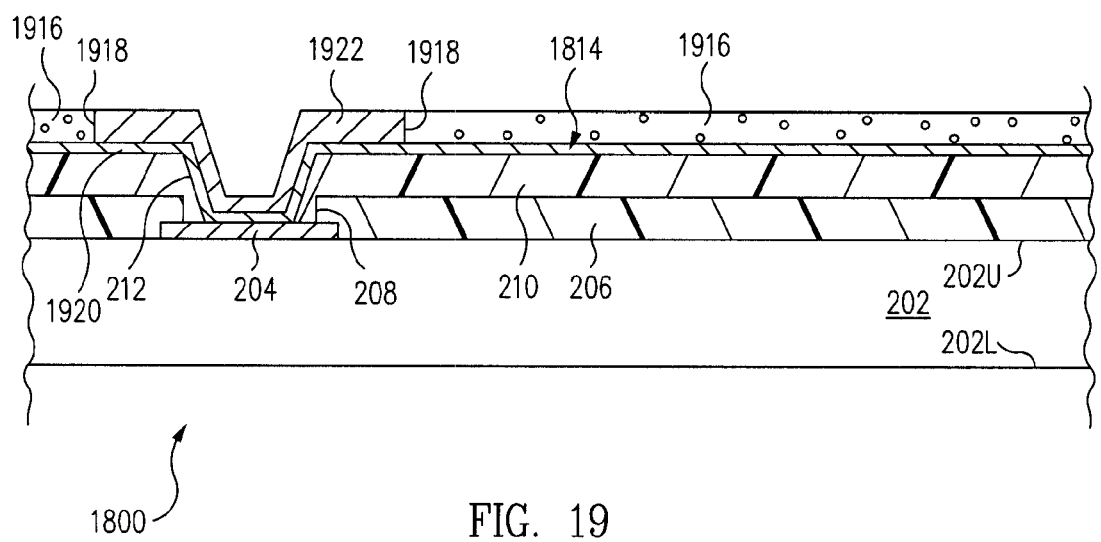
FIGS. 19, 20, 21, 22 are cross-sectional views of the bumped chip package of FIG. 18 at further stages during fabrication in accordance with various embodiments.

FIG. 19 is a cross-sectional view of bumped chip package 1800 of FIG. 18 at a further stage during fabrication in accordance with one embodiment. Referring now to FIGS. 17 and 19 together, from form seed layer operation 106A, flow moves to an apply resist operation 1708. In apply resist operation 1708, a dielectric resist 1916 is applied. Resist 1916, e.g., a photoresist, entirely covers seed layer 1814.

From apply resist operation 1708, flow moves to a pattern resist operation 1710. In pattern resist operation 1710, resist 1916 is patterned to form an UBM pattern artifact 1918 therein. UBM pattern artifact 1918 is a patterned opening extending entirely through resist 1916 and exposing a UBM pattern portion 1920 of seed layer 1814. In one embodiment, UBM pattern artifact 1918 is a positive image of the UBM pattern to be formed.

UBM pattern artifact 1918 exposes a portion of seed layer 1814 within dielectric layer opening 212. Further, UBM pattern artifact 1918 exposes a portion of seed layer 1814 extending outwards from dielectric layer opening 212 and on to the upper surface of dielectric layer 210 around the periphery of dielectric layer opening 212

From pattern resist operation 1710, flow moves to a plate Under Bump Metallization (UBM) pattern operation 1712. In plate UBM pattern operation 1712, an electrically conductive UBM pattern 1922 is plated in UBM pattern artifact 1918 using seed layer 1814 as a plating electrode. More particularly, UBM pattern 1922 is plated on UBM pattern portion 1920 of seed layer 1814. As discussed above, UBM pattern portion 1920 was exposed by UBM pattern artifact 1918. Illustratively, UBM pattern 1922 is a single layer of nickel or gold although can be formed of other electrically conductive materials, e.g., can be formed of two or more layers of metal such as a nickel and gold bi-layer.

UBM pattern 1922 completely fills UBM pattern artifact 1918 in accordance with this embodiment.

Figure 20:
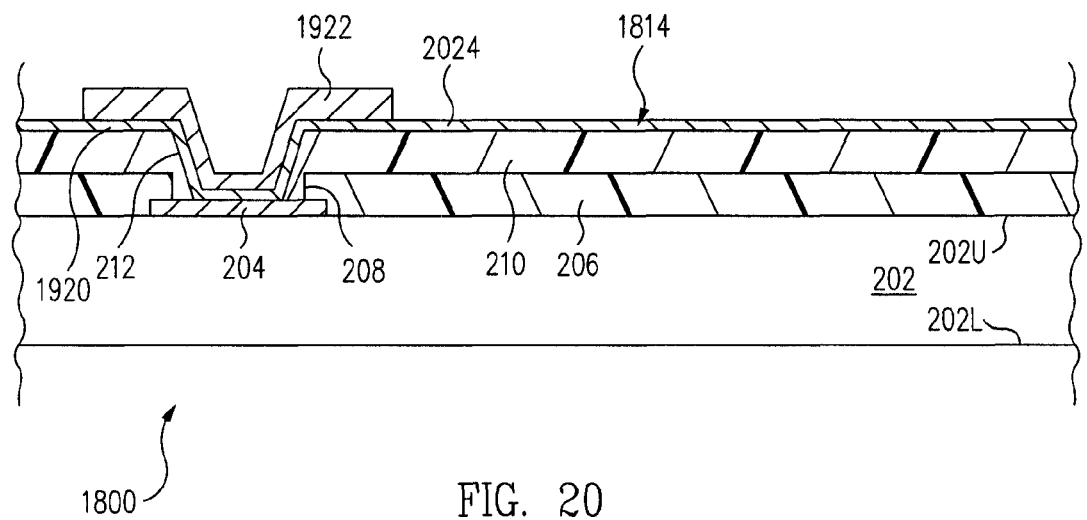

FIG. 20 is a cross-sectional view of bumped chip package 1800 of FIG. 19 at a further stage during fabrication in accordance with one embodiment. Referring now to FIGS. 17, 19 and 20 together, from plate UBM pattern operation 1712, flow moves to a strip resist operation 1714. In strip resist operation 1714, resist 1916 is stripped, i.e., removed. Accordingly, after removal of resist 1916, an exposed portion 2024, sometimes called an un-plated portion, of seed layer 1814 is exposed.

More particularly, seed layer 1814 includes UBM pattern portion 1920 covered by UBM pattern 1922 and exposed portion 2024 uncovered by UBM pattern 1922.

Figure 21:
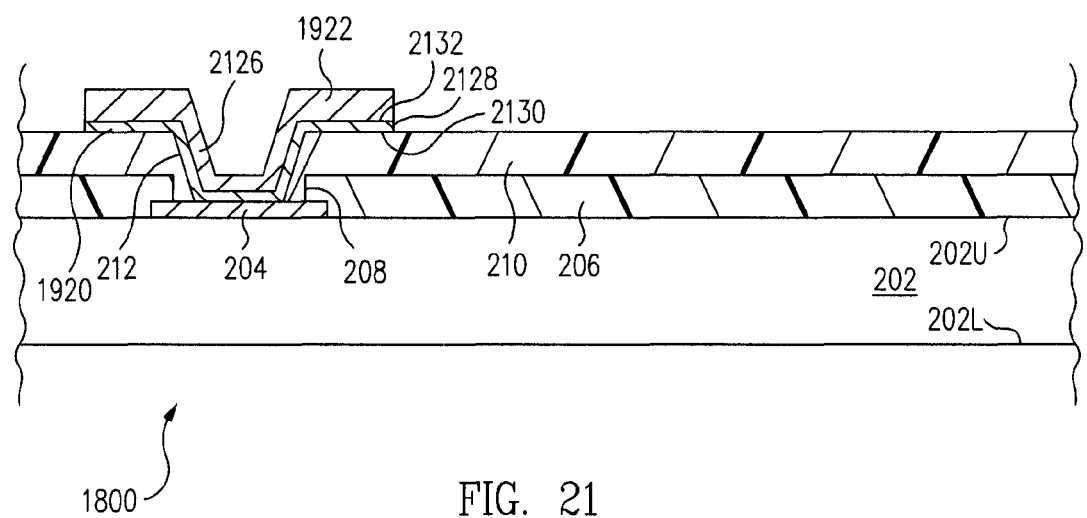

FIG. 21 is a cross-sectional view of bumped chip package 1800 of FIG. 20 at a further stage during fabrication in accordance with one embodiment. Referring now to FIGS. 17, 20 and 21 together, from strip resist operation 1714, flow moves to a remove seed layer by laser-ablation operation 1716. In remove seed layer by laser-ablation operation 1716, exposed portion 2024 of seed layer 1814 is removed, i.e., laser-ablated, by laser-ablation.

During this laser-ablation process, a laser beam is directed at exposed portion 2024 of seed layer 1814 and moved. The laser beam laser-ablates and entirely removes exposed portion 2024 of seed layer 1814. Of course, UBM pattern portion 1920 of seed layer 1814 remains between UBM pattern 1922 and dielectric layer 210.

UBM pattern 1922 defines a solder ball land. UBM pattern 1922 includes an electrically conductive via 2126 extending through dielectric layer opening 212 and being electrically connected to substrate terminal 204 through UBM pattern portion 1920 of seed layer 1814. UBM pattern 1922 further extends outwards from dielectric layer opening 212 and on to the upper surface of dielectric layer 210 around the periphery of dielectric layer opening 212. Although a single solder ball land of UBM pattern 1922 is illustrated and discussed, in light of this disclosure, those of skill in the art will understand that UBM pattern 1922 includes a plurality of similar solder ball lands.

By using a laser-ablation process to remove exposed portion 2024 of seed layer 1814, a chemical etching process is avoided. Accordingly, the generation of hazardous waste from a chemical etching process is avoided thus eliminating the need to treat or dispose of the chemical etching hazardous waste.

In one embodiment, exposed portion 2024 of seed layer 1814 is vaporized during the laser-ablation process, removed by a vacuum process, recaptured, and recycled. In this manner, the material of exposed portion 2024 is recycled thus reducing costs and the impact upon the environment.

Further, by using a laser-ablation process to remove exposed portion 2024 of seed layer 1814, etching of UBM pattern 1922 is avoided. Accordingly, UBM pattern width erosion and undercut of UBM pattern 1922 associated with a chemical etching process are avoided.

In one embodiment, after laser-ablation removal of exposed portion 2024 of seed layer 1814, the remaining UBM pattern portion 1920 of seed layer 1814 is formed with perpendicular sidewalls 2128. More particularly, UBM pattern portion 1920 includes a lower, e.g., first, surface 2130 on dielectric layer 210 and an upper, e.g., second, surface 2132 upon which UBM pattern 1922 is plated. Perpendicular sidewalls 2128 extend perpendicularly between lower surface 2130 and upper surface 2132.

Further, by using a laser-ablation process to remove exposed portion 2024 of seed layer 1814, UBM pattern 1922 can be formed to have a minimum distance between features, e.g., solder ball lands. More particularly, the requirement to provide a minimum spacing between features of UBM pattern 1922 to allow sufficient contact between seed layer 1814 and the chemical etching solution is eliminated. Accordingly, UBM pattern 1922 can be formed with a minimum inner feature spacing.

Figure 22:
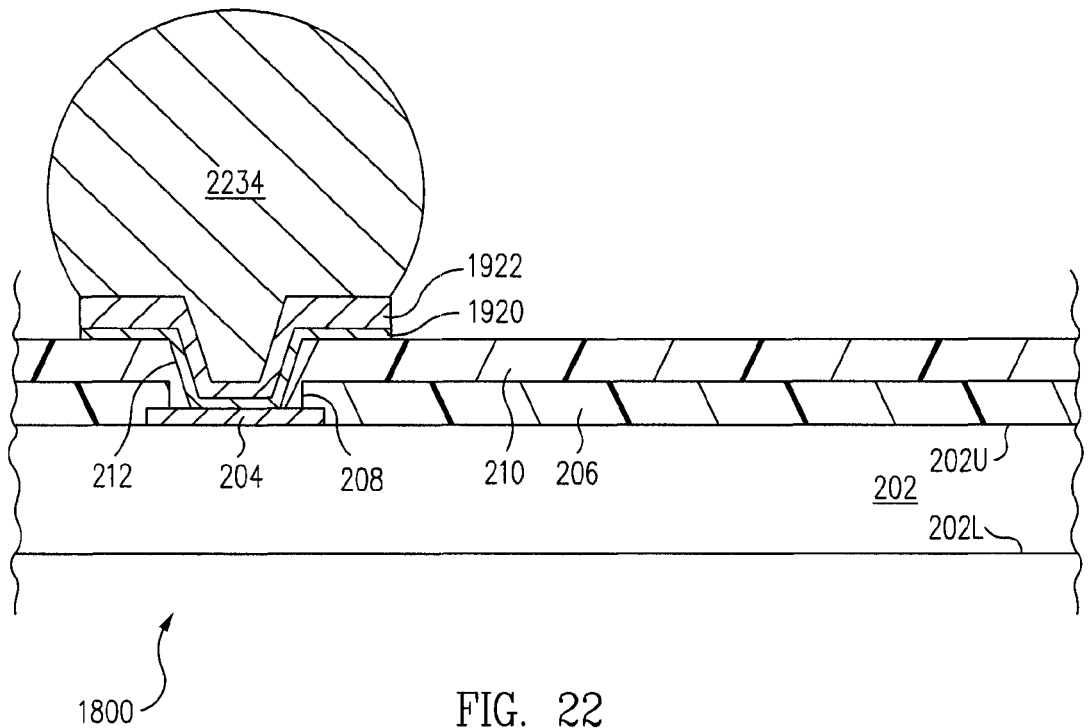

FIG. 22 is a cross-sectional view of bumped chip package 1800 of FIG. 21 at a further stage during fabrication in accordance with one embodiment. Referring now to FIGS. 17 and 22 together, from remove seed layer by laser-ablation operation 1716, flow moves to apply solder balls operation 134. In apply solder balls operation 134, solder balls, e.g., pieces of solder, are applied to UBM pattern 1922, and specifically, on lands of UBM pattern 1922 in a manner similar to that discussed above regarding apply solder balls operation 134 of FIG. 1, and so is not repeated for simplicity of discussion.

From apply solder balls operation 134, flow moves to reflow solder balls to form interconnection balls operation 136. In reflow solder balls to form interconnection balls operation 136, the solder balls applied in apply solder balls operation 134 are reflowed to form interconnection balls 2234 in a manner similar to that discussed above regarding reflow solder balls to form interconnection balls operation 136 of FIG. 1, and so is not repeated for simplicity of discussion In the above manner, interconnection balls 2234, i.e., means for physically and electrically connecting bumped chip package 1800, are formed, aligned with, and electrically connected to substrate terminals 204. Interconnection balls 2234 are reflowed to mount bumped chip package 1800 to a larger substrate such as a printed circuit motherboard.

Figure 23:
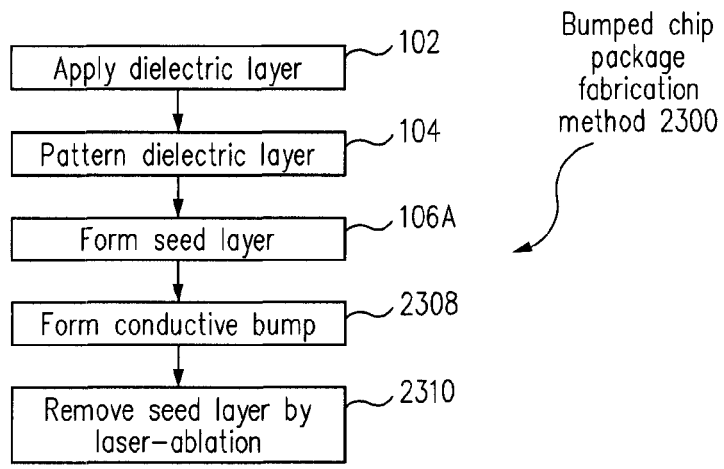
FIG. 23 is a bumped chip package fabrication method in accordance with another embodiment of the present invention.
Figure 24:
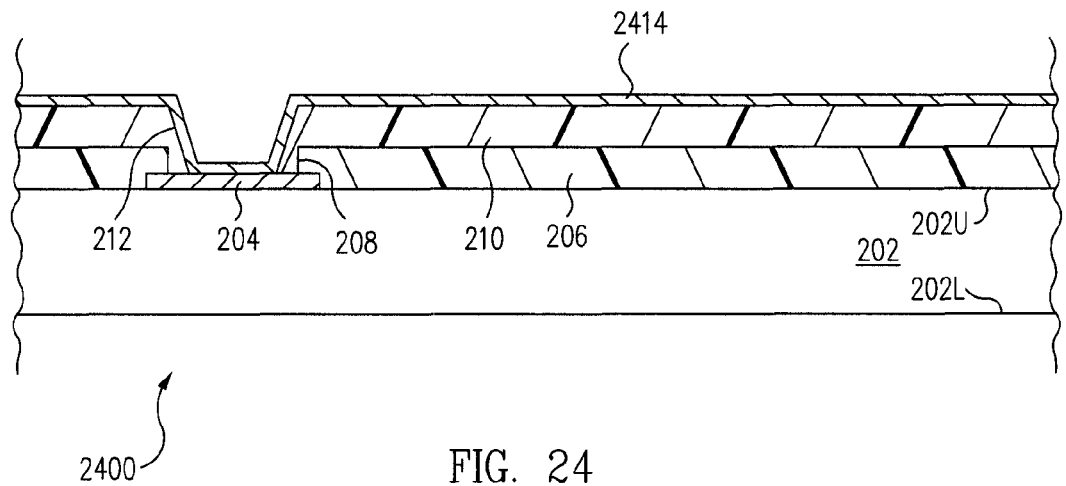
FIG. 24 is a cross-sectional view of a bumped chip package during fabrication in accordance with one embodiment.

FIG. 23 is a bumped chip package fabrication method 2300 in accordance with another embodiment of the present invention. FIG. 24 is a cross-sectional view of a bumped chip package 2400 during fabrication in accordance with one embodiment. Bumped chip package 2400 of FIG. 24 is similar to bumped chip package 200 of FIG. 2 and only the significant differences between bumped chip packages 2400, 200 are discussed below.

Referring now to FIGS. 23 and 24 together, bumped chip package 2400 includes substrate 202 having upper surface 202U, lower surface 202L, and substrate terminal 204. Substrate 202 further includes passivation layer 206 having passivation layer opening 208 exposing a portion of substrate terminal 204.

In apply dielectric layer operation 102, a dielectric layer 210 is applied in manner similar to that discussed above regarding apply dielectric layer operation 102 of FIG. 1 and so is not repeated for simplicity.

From apply dielectric layer operation 102, flow moves to pattern dielectric layer operation 104. In pattern dielectric layer operation 104, dielectric layer 210 is patterned to form a dielectric layer opening 212 therein in manner similar to that discussed above regarding pattern dielectric layer operation 104 of FIG. 1 and so is not repeated for simplicity.

From pattern dielectric layer operation 104, flow moves to a form seed layer operation 106A. In form seed layer operation 106A, a seed layer 2414 is blanket formed. Seed layer 2414 of FIG. 24 is similar to first seed layer 214 of FIG. 2 and so is not discussed in detail for simplicity.

Figure 25:
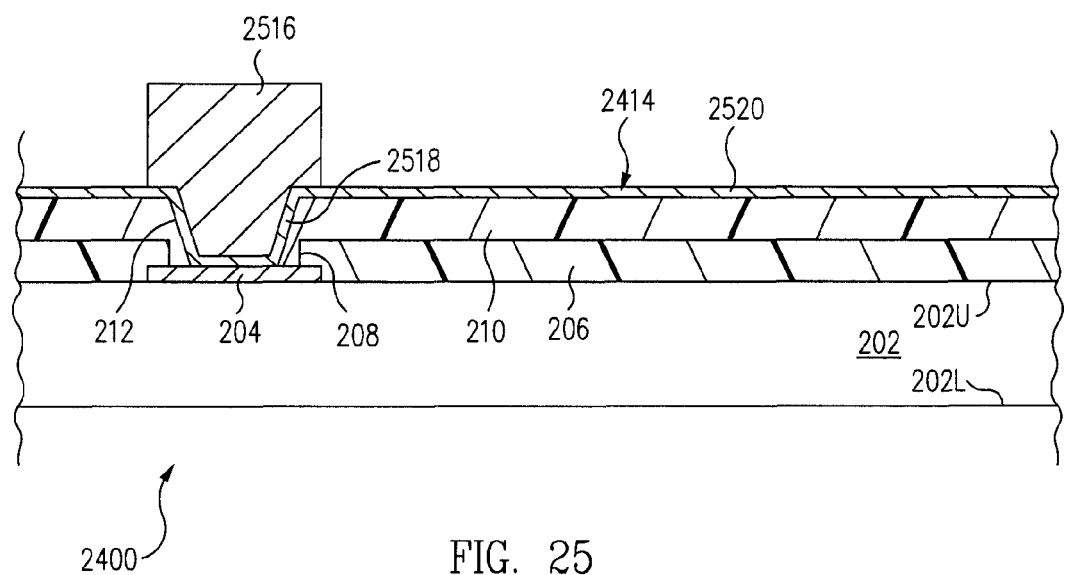
FIGS. 25, 26 are cross-sectional views of the bumped chip package of FIG. 24 at further stages during fabrication in accordance with various embodiments.

FIG. 25 is a cross-sectional view of bumped chip package 2400 of FIG. 24 at a further stage during fabrication in accordance with one embodiment. Referring now to FIGS. 23 and 25 together, from form seed layer operation 106A, flow moves to a form conductive bump operation 2308. In form conductive bump operation 2308, a conductive bump 2516, e.g., a copper pillar, is formed directly above substrate terminal 204.

Bump 2516 if formed on a bump pattern portion 2518 of seed layer 2414. Bump pattern portion 2518 of seed layer 2414 includes the portion of seed layer 2414 within dielectric layer opening 212. Further, bump pattern portion 2518 of seed layer 2414 includes the portion of seed layer 2414 extending outwards from dielectric layer opening 212 and on to the upper surface of dielectric layer 210 around the periphery of dielectric layer opening 212. Further, an exposed portion 2520 of seed layer 2414 is not covered by bump 2516 and exposed.

Illustratively, bump 2516 is selectively plated, e.g., using a patterned resist or other selectively plating technique, on bump pattern portion 2518 of seed layer 2414 using seed layer 2414 as the plating electrode.

Figure 26:
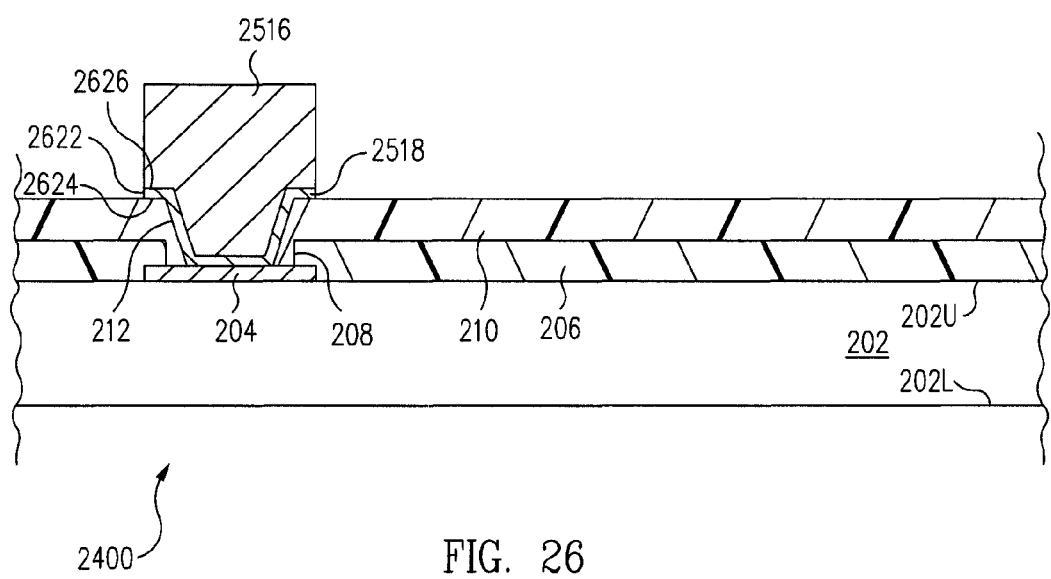

FIG. 26 is a cross-sectional view of bumped chip package 2400 of FIG. 25 at a further stage during fabrication in accordance with one embodiment. Referring now to FIGS. 23, 25 and 26 together, from form conductive bump operation 2308, flow moves to a remove seed layer by laser-ablation operation 2310. In remove seed layer by laser-ablation operation 2310, exposed portion 2520 of seed layer 2414 is removed, i.e., laser-ablated, by laser-ablation.

During this laser-ablation process, a laser beam is directed at exposed portion 2520 of seed layer 2414 and moved. The laser beam laser-ablates and entirely removes exposed portion 2520 of seed layer 2414. Of course, bump pattern portion 2518 of seed layer 2414 remains between bump 2516 and dielectric layer 210.

Bump 2516 extends through dielectric layer opening 212 and is electrically connected to substrate terminal 204 through bump pattern portion 2518 of seed layer 2414. Bump 2516 further extends outwards from dielectric layer opening 212 and on to the upper surface of dielectric layer 210 around the periphery of dielectric layer opening 212. Although a single bump 2516 is illustrated and discussed, in light of this disclosure, those of skill in the art will understand that a plurality of similar bumps are formed.

By using a laser-ablation process to remove exposed portion 2520 of seed layer 2414, a chemical etching process is avoided. Accordingly, the generation of hazardous waste from a chemical etching process is avoided thus eliminating the need to treat or dispose of the chemical etching hazardous waste.

In one embodiment, exposed portion 2520 of seed layer 2414 is vaporized during the laser-ablation process, removed by a vacuum process, recaptured, and recycled. In this manner, the material of exposed portion 2520 is recycled thus reducing costs and the impact upon the environment.

Further, by using a laser-ablation process to remove exposed portion 2520 of seed layer 2414, etching of bump 2516 is avoided. Accordingly, bump width erosion and undercut of bump 2516 associated with a chemical etching process are avoided.

In one embodiment, after laser-ablation removal of exposed portion 2520 of seed layer 2414, the remaining bump pattern portion 2518 of seed layer 2414 is formed with perpendicular sidewalls 2622. More particularly, bump pattern portion 2518 includes a lower, e.g., first, surface 2624 on dielectric layer 210 and an upper, e.g., second, surface 2626 upon which bump 2516 is formed. Perpendicular sidewalls 2622 extend perpendicularly between lower surface 2624 and upper surface 2626.

Further, by using a laser-ablation process to remove exposed portion 2520 of seed layer 2414, a minimum feature distance between bumps 2516 can be realized. More particularly, the requirement to provide a minimum spacing between bumps 2516 to allow sufficient contact between the chemical etching solution and exposed portion 2520 of seed layer 2414 is eliminated. Accordingly, bumps 2516 can be formed with a minimum inner feature spacing.

In the above manner, bumps 2516, i.e., means for physically and electrically connecting bumped chip package 2400, are formed, aligned with, and electrically connected to substrate terminals 204. Bumps 2516 are used to mount bumped chip package 2400 to a larger substrate such as a printed circuit motherboard.

Although formation of individual packages is described above, in other embodiments, a plurality of packages are formed simultaneously in an array, e.g., on a wafer, using the methods as described above. The array (wafer) is singulated to singulate the individual packages from one another.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A method of fabricating a bumped chip package comprising:

forming a first seed layer on a dielectric layer, the dielectric layer comprising a dielectric layer opening exposing a substrate terminal of a substrate, the first seed layer being formed within the dielectric layer opening and on the substrate terminal;

plating a circuit pattern on the first seed layer, wherein an exposed portion of the first seed layer is exposed from the circuit pattern; and removing the exposed portion of the first seed layer by laser-ablation.

2. The method of claim 1 wherein after the removing, a remaining circuit pattern portion of the first seed layer comprises perpendicular sidewalls.

3. The method of claim 1 wherein the removing comprises vaporizing the exposed portion of the first seed layer with a laser.

4. The method of claim 3 wherein the removing further comprises recapturing and recycling the vaporized exposed portion.

5. The method of claim 1 wherein the substrate further comprises a passivation layer, the passivation layer comprising a passivation layer opening exposing the substrate terminal.

6. The method of claim 5 further comprising applying the dielectric layer, the dielectric layer filling the passivation layer opening.

7. The method of claim 6 further comprising patterning the dielectric layer to form the dielectric layer opening.

8. The method of claim 7 further comprising:

applying a first resist to the first seed layer;

patterning the first resist to form a circuit pattern artifact therein, the circuit pattern artifact exposing a circuit pattern portion of the first seed layer, wherein the plating the circuit pattern comprises plating the circuit pattern in the circuit pattern artifact using the first seed layer as a plating electrode.

9. The method of claim 8 further comprising stripping the first resist.

10. The method of claim 9 further comprising applying a buildup dielectric layer to the circuit pattern and the dielectric layer.

11. The method of claim 10 further comprising patterning the buildup dielectric layer to form a buildup dielectric layer opening therein, the buildup dielectric layer opening exposing an extension of the circuit pattern.

12. The method of claim 11 further comprising forming a second seed layer on the buildup dielectric layer, the second seed layer being formed within the buildup dielectric layer opening and on the extension of the circuit pattern.

13. The method of claim 12 further comprising plating an Under Bump Metallization (UBM) pattern on the second seed layer, wherein an exposed portion of the second seed layer is exposed from the UBM pattern; and removing the exposed portion of the second seed layer by laser-ablation.

14. The method of claim 13 wherein after the removing the exposed portion of the second seed layer, a remaining UBM pattern portion of the second seed layer comprises perpendicular sidewalls.

15. A method of fabricating a bumped chip package comprising:

forming a seed layer on a dielectric layer, the dielectric layer comprising a dielectric layer opening exposing a substrate terminal of a substrate, the seed layer being formed within the dielectric layer opening and on the substrate terminal;

plating an Under Bump Metallization (UBM) pattern on the seed layer, wherein an exposed portion of the seed layer is exposed from the UBM pattern; and removing the exposed portion of the seed layer by laser-ablation.

16. The method of claim 15 further comprising:

applying a resist to the seed layer;

patterning the resist to form a UBM pattern artifact therein, the UBM pattern artifact exposing a UBM pattern portion of the seed layer, wherein the plating the UBM pattern comprises plating the UBM pattern to partially fill the UBM pattern artifact using the seed layer as a plating electrode; and filling the UBM pattern artifact with solder.

17. The method of claim 16 further comprising reflowing the solder to form an interconnection ball on the UBM pattern.

18. The method of claim 15 wherein after the removing, a remaining UBM pattern portion of the seed layer comprises perpendicular sidewalls.

19. A method of fabricating a bumped chip package comprising:

forming a seed layer on a dielectric layer, the dielectric layer comprising a dielectric layer opening exposing a substrate terminal of a substrate, the seed layer being formed within the dielectric layer opening and on the substrate terminal;

forming a conductive bump on the seed layer, wherein an exposed portion of the seed layer is exposed from the bump; and removing the exposed portion of the seed layer by laser-ablation.

20. The method of claim 19 wherein after the removing, a remaining bump pattern portion of the seed layer comprises perpendicular sidewalls.

* * * * *